(12) United States Patent
Josephson et al.

(10) Patent No.: US 6,408,426 B1
(45) Date of Patent: Jun. 18, 2002

(54) METHOD FOR DETERMINING LOCATIONS OF INTERCONNECT REPEATER FARMS DURING PHYSICAL DESIGN OF INTEGRATED CIRCUITS

(75) Inventors: Jon Eric Josephson, Fort Collins; John D Wanek, Denver, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,442

(22) Filed: Feb. 19, 2000

(51) Int. Cl.$^7$ .............................................. G06F 17/50
(52) U.S. Cl. ................................ 716/12; 716/9; 716/10
(58) Field of Search ......................................... 716/1–21

(56) References Cited

U.S. PATENT DOCUMENTS

| | | | | |
|---|---|---|---|---|
| 5,799,170 A | * | 8/1998 | Drumm et al. ................. | 716/2 |
| 5,859,999 A | | 1/1999 | Morris et al. ................. | 712/224 |
| 5,860,017 A | | 1/1999 | Sharangpani et al. ......... | 712/23 |
| 5,912,820 A | * | 6/1999 | Kerzman et al. .............. | 716/6 |
| 5,923,570 A | * | 7/1999 | Shigemoto .................... | 716/16 |
| 5,946,477 A | * | 8/1999 | Ito ................................. | 716/9 |
| 6,266,803 B1 | * | 7/2001 | Scherer et al. ................ | 716/12 |

OTHER PUBLICATIONS

Brasen et al. ("Post–placement buffer reoptimization", Proceedings of Compass Design Automation, Euro ASIC '92, Jun. 1, 1992, pp. 156–161).*

Tellez et al. ("Minimal buffer insertion in clock trees with skew and slew rate constraints", IEEE Transactions on Computer–Aided Design of Integrated Circuits and Systems, vol. 16, No. 4, Apr. 1997, pp. 333–342).*

Zhou et al. ("Simultaneous routing and buffer insertion with restrictions on buffer locations", Proceedings of 36th Design Automation Conference, Jun. 21, 1999, pp. 96–99).*

NN9305307 ("Clock Distribution Tree for Minimal Clock Skew", IBM Technical Disclosure Bulletin, vol. 36, No. 5, May 1993, pp. 307–308 (4 pages)).*

Wolfe, Alexander, "Patents Shed Light on Merced," Electronic Engineering Times, Feb. 15, 1999, pp. 43–44.

Interactive Repeater Insertion Simulator (IRIS) System And Method, application NO. 09/329556, Filed Jun. 10, 1999, Inventor: John D. Wanek.

* cited by examiner

*Primary Examiner*—Matthew Smith
*Assistant Examiner*—Phallaka Kik (57) ABSTRACT

A method and system for determining locations of interconnect repeater farms in the physical design of an integrated circuit is presented. The optimal unconstrained repeater locations are calculated for a given routing list of interconnect nets. Repeater farms are defined in areas of concentration of the calculated optimal unconstrained repeater locations. The optimal constrained repeater locations are then calculated such that the repeater locations are constrained to the repeater farms. A set of sub-optimal interconnect nets which are hurt the most from the repeater farm constraint are selected. The optimal unconstrained repeater locations for the selected set of sub-optimal interconnect nets are then calculated and additional repeater farms are defined to encompass areas of concentration of the optimal repeater locations of the sub-optimal interconnect nets. The process is repeated until desired performance gain is achieved.

8 Claims, 6 Drawing Sheets

METHOD FOR DETERMINING LOCATIONS OF INTERCONNECT REPEATER FARMS DURING PHYSICAL DESIGN OF INTEGRATED CIRCUITS

FIELD OF THE INVENTION

The present invention pertains generally to integrated circuit interconnect routing, and more particularly to a method for determining locations of interconnect repeater farms during the physical design stage of integrated circuits.

BACKGROUND OF THE INVENTION

Integrated circuits comprise a plurality of electronic components that function together to implement a higher-level function. ICs are formed by implanting a pattern of transistors into a silicon wafer which are then connected to each other by layering multiple layers of metal materials, interleaved between dielectric material, over the transistors. The fabrication process entails the development of a schematic diagram that defines the circuits to be implemented. A chip layout is generated from the schematic. The chip layout, also referred to as the artwork, comprises a set of planar geometric shapes over several layers that implement the circuitry defined by the schematic. A mask is then generated for each layer based on the chip layout. Each metal is then successively manufactured over the silicon wafer according to the layer's associated mask using a photolithographical technique.

The process of converting the specifications of an electrical circuit schematic into the layout is called the physical design process. CAD tools are extensively used during all stages of the physical design process. The physical design process is accomplished in several stages including partitioning, floorplanning, and routing.

During the partitioning stage, the overall integrated circuit is partitioned into a set of functional subcircuits called blocks. The block partitioning process considers many factors including the number and size of the blocks, and number of interconnections between the blocks. The output of partitioning is a set of blocks along with a set of interconnections required between blocks, referred to herein as a netlist.

During the floorplanning stage, a floorplan is developed defining the placement and rectangular shape of each block. The goal of the floorplanning stage is to select the optimal layout for each block, as well as for the entire chip.

Once an acceptable floorplan is developed, the interconnections between the blocks (as defined by the netlist) are routed. The space not occupied by the blocks is partitioned into rectangular regions referred to as channels. Interconnects are preferably routed within the designated channels, but may also be routed through defined feedthroughs through the blocks, or in defined over-the-block routing space.

The goal of a router is to complete all circuit connections resulting in minimal interconnect signal delay. Where possible, the router will generally attempt to route individual interconnects on a single layer; however, if this is not achievable given the topology of the netlist, an interconnect may be routed over two or even more layers. Often, interconnect routes resulting from the autorouting will be too long to meet signal delay specifications. The delay results from the inherent RC characteristics of the interconnect line. Signal transition time can often be significantly improved by introducing one or more signal repeaters along the path of the interconnect line.

Over the past decades, integrated circuits (ICs) of increasingly higher density have been developed to meet industry demands of higher performance and smaller packaging. The very high densities of today's integrated circuits means that more metal layers and interconnects per layer are required than ever before. The result is that the routing task has become even more complex, often resulting in a higher number of interconnects that do not meet the timing criteria, and therefore an increasingly higher number of required repeaters.

When over-the-block routing is employed, the insertion of repeaters along the over-the-block interconnects is problematic due to the need to be able to connect from the metal layer on which the problem interconnect resides, through any intervening layers, to the repeaters ports. More particularly, in order to be able to insert a repeater at a location along the interconnect, necessary metal resources must be reserved in order to create the connections between the interconnect and repeater ports through any intervening metal layers.

Because the locations of the optimal repeater locations is unknown prior to routing the interconnects, repeater locations are typically constrained to lie in reserved repeater areas called "repeater farms". This allows the necessary metal resources to be reserved in each layer prior to routing to guarantee the ability to complete interconnect-to-repeater connections of repeaters inserted along interconnects within a repeater farms.

The process of determining the best locations of the repeater farms has itself become complex. The increased number of interconnects required by higher density circuits increases the likelihood of more problem interconnects generated during the routing phase. The limitation of repeater locations to repeater farms along with the higher number of interconnects increases the possibility that no satisfactory route solutions exist for an interconnect. Thus, unless the repeater farms are optimally located, the probability of an increased number of unsatisfactory interconnects is higher in higher density circuits. Accordingly, a need exists for a method for determining optimal locations of interconnect repeaters farms during the physical design of an integrated circuit. It would be desirable if this method were automated.

SUMMARY OF THE INVENTION

The present invention is a novel method and system for optimally locating interconnect repeater farms during the physical design of an integrated circuit. In accordance with the invention, the optimal unconstrained repeater locations is calculated in an unconstrained mode to generate a list of unconstrained legal repeater locations for a given routing list. A set of repeater farms are defined to encompass areas of concentration of the calculated unconstrained legal repeater locations. The optimal constrained repeater locations are than calculated, constraining the repeater locations to locations within the repeater farms. A set of sub-optimal nets are then selected to include those nets of the routing list that were hurt the most as a result of the constraint to the repeater farms. The optimal unconstrained repeater locations of the selected sub-optimal nets are then calculated and additional repeater farms are defined to encompass areas of concentration of the optimal unconstrained repeater locations of the sub-optimal nets. The process repeated until desired performance gain is achieved.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and system for optimally locating interconnect repeater farms during the physical design of an integrated circuit is described in detail hereinafter. Although the invention is described in terms of specific illustrative embodiments, such as specifically-identified CAD tools, it is to be understood that scope of the invention is not limited thereby.

Figure 1:
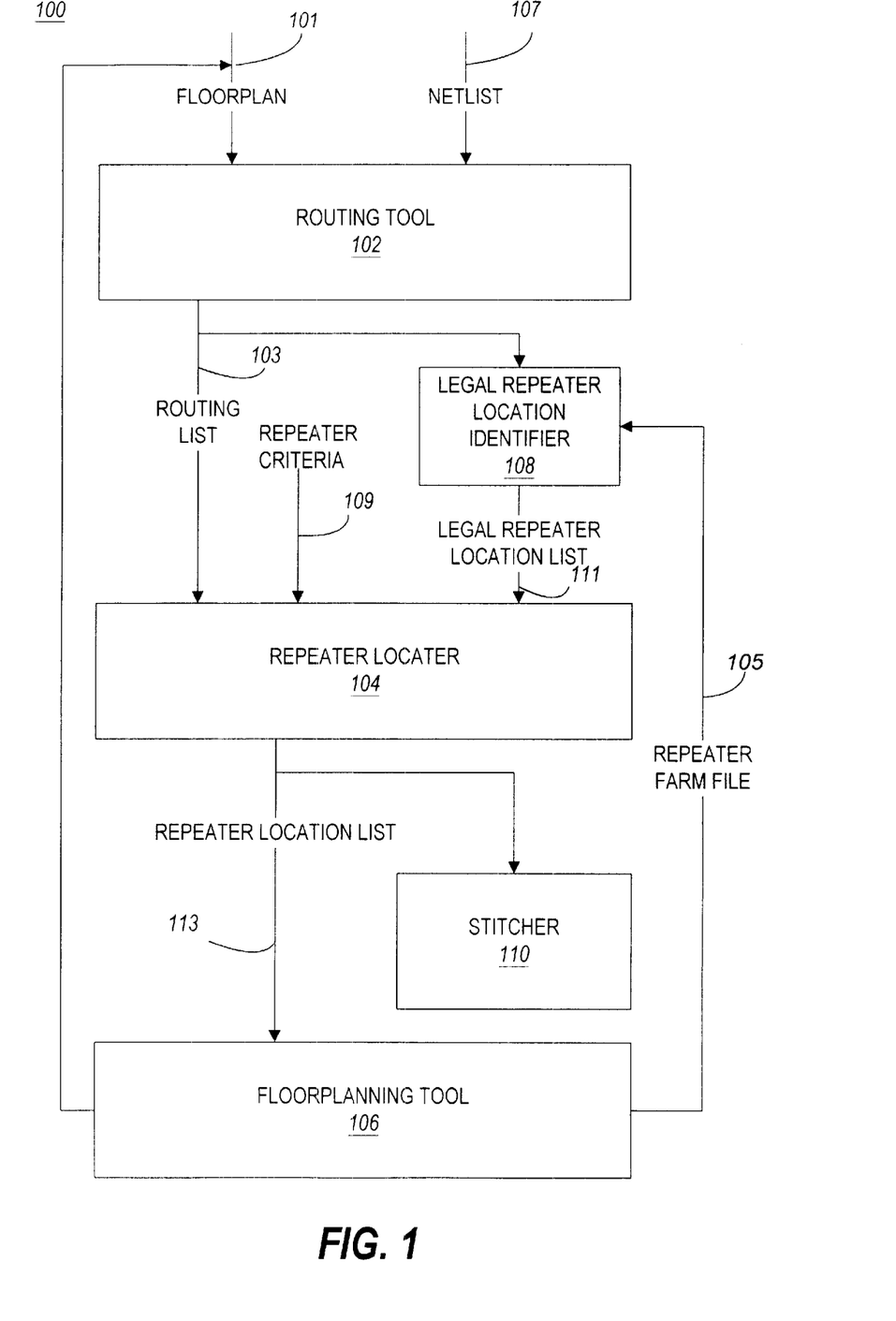
FIG. 1 is a block diagram of an illustrative embodiment of a CAD tool environment in which the method of the invention is implemented.

FIG. 1 is a block diagram of an illustrative embodiment of a CAD tool environment 100 in which the method of the invention is implemented. CAD tool environment 100 may comprise a single software package that implements all of the features shown and described with respect to FIG. 1, or alternatively may comprise several software tools that together implement al the features. CAD tool environment 100 includes a routing tool 102, a repeater locator tool 104, a legal repeater location identifier tool 108, a graphical floorplan tool 106, and a repeater stitcher tool 110. In the illustrative embodiment, routing tool 102 and graphical floorplan tool 106 are embodied by IC Craftsman, manufactured by Cadence Corp. Repeater locator tool 104 is embodied by a proprietary tool called SPO which implements the method described in detail in U.S. patent application Ser. No. 09/329,556 to Wanek et al., entitled "Interactive Repeater Insertion Simulator", filed May 10, 1999, and is incorporated herein by reference for all that it teaches. Legal repeater location identifier tool 108 is embodied by a small perl script. Stitcher tool 110 is embodied by a software tool implemented in accordance with co-pending U.S. patent application Ser. No. 09/507,034, entitled "In-Place Method For Inserting Repeater Buffers In An Integrated Circuit" to Josephson et al., filed Feb. 18, 2000, and is incorporated herein by reference for all that it teaches.

Routing tool 102 routes the interconnects defined by a netlist 107 of a previously mapped layout (e.g., using the floorplan tool 106) within the routing regions, which include channels, feedthroughs, and over-the-block regions. Routing tool 102 generates a routing list 103 which defines the interconnect nets generated during the routing process.

Legal repeater location identifier tool 108 determines a set of legal repeater locations for each net in the routing list 103 based on information from the floorplanning tool 106 that describes the legal areas for inserting repeaters. Preferably, this is in the form of a repeater farm file 105 which defines the set aside areas for repeaters. Legal repeater location identifier tool 108 generates a legal repeater location list 111 identifying the set of legal repeater locations on each net that passes over a repeater farm.

Repeater locator tool 104 implements an algorithm that determines the optimal repeater locations of each interconnect net of routing list 103. Repeater locator tool 104 can be run in an unconstrained mode which allows the tool 104 to calculate the optimal repeater locations for each interconnect net in the routing list 103 without consideration of the locations of actual legal repeater locations (i.e., those locations where metal has been reserved for interconnect-to-repeater connections). Repeater locator tool 104 can also be run a constrained mode. In this mode, the tool 104 determines the optimal repeater locations for each net, considering only locations in the net's corresponding legal repeater location set from legal repeater location list 111. In each mode, the determination of the optimal locations is based on a set of user-defined repeater criteria 109 such as propagation delay, transition times, and required repeater size. Repeater locator tool 104 generates a repeater location list 113 containing the optimal unconstrained repeater locations or optimal constrained repeater locations of each net, depending on whether the tool was run in unconstrained or constrained mode respectively.

Stitcher 110 stitches a repeater in-place between each net at its optimal constrained repeater location as defined in the optimal constrained repeater location list 113.

Graphical floorplan tool 106 provides a positional view of the repeater locations designated in the repeater location list 113 with respect to the overall floorplan 101, netlist 107, and repeater criteria 109. In the preferred embodiment, the positional view is generated in the form of a repeater location scattergram.

Figure 2:
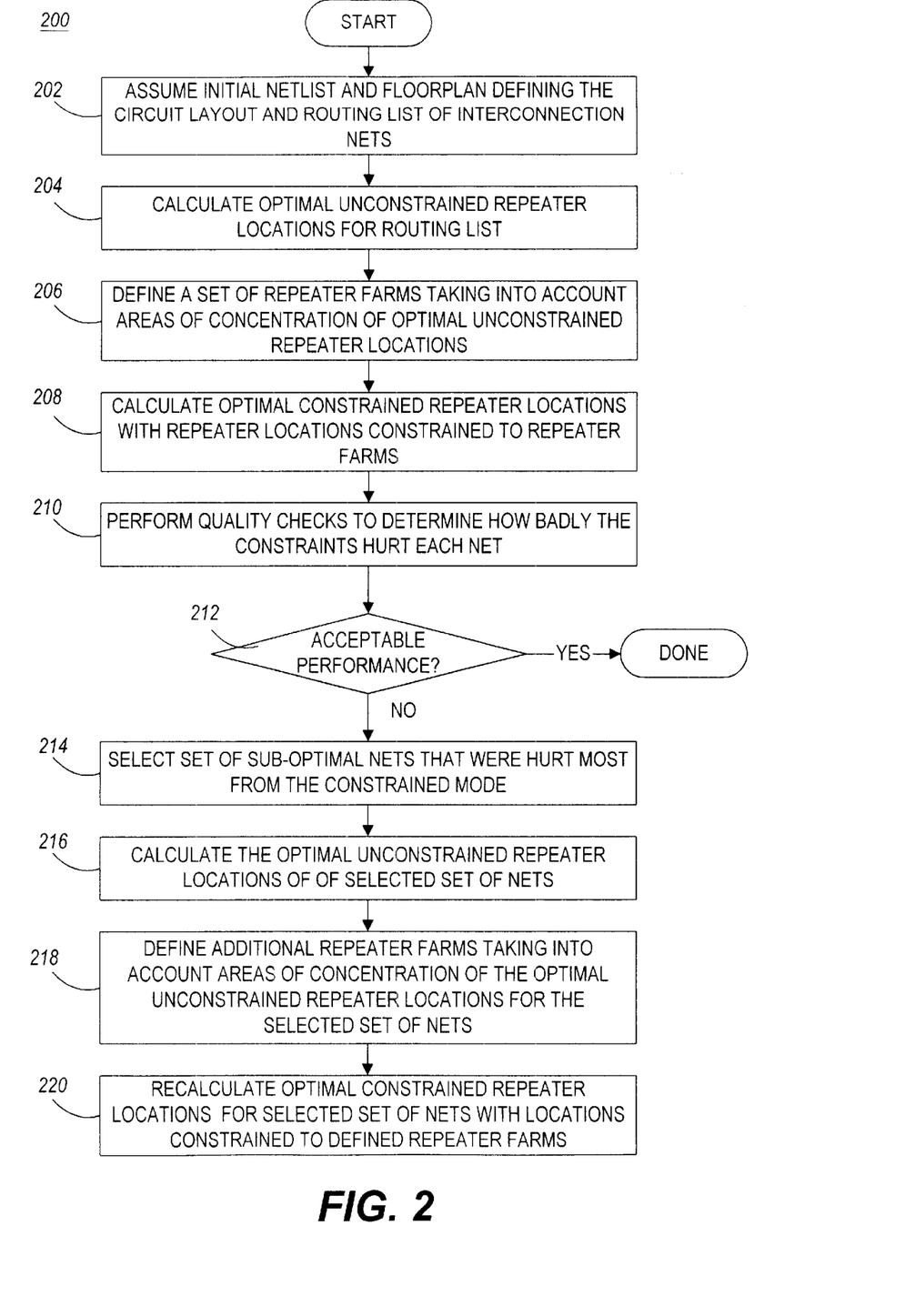
FIG. 2 is a flowchart of the general method of the invention.

FIG. 2 is a flowchart of the general method 200 of the invention. The method assumes 202 an initial netlist and floorplan defining the circuit layout, and an initial routing list defining the interconnection nets without repeaters. According to the method of the invention, optimal unconstrained repeater locations are calculated 204 for each net in the routing list. A set of repeater farms are then defined 206 in the areas of concentration of the optimal unconstrained repeater locations. Optimal constrained repeater locations are then calculated 208 with repeater locations constrained to a set of legal repeater locations. Quality checks are performed 210 on the nets with constrained repeater locations to determine how badly the constraints hurt each net. A determination is made 212 as to whether all the nets, when constrained to repeaters residing in any of the defined repeater farms, are acceptable to the designer. If so, the method is complete and the repeater farms defined during the process are implemented in the physical design. If not, a set of suboptimal nets is selected 214 from the full set of nets that comprise those nets that were hurt the most from the constrained mode (e.g., those nets that suffer degradation of signal delay after the recalculation of the legal repeater locations than before the recalculation). The optimal unconstrained repeater locations are then calculated 216 for the nets in the selected set of nets. Additional repeater farms are then defined 218, taking into account the optimal unconstrained repeater locations of the selected set of nets. The optimal constrained repeater locations are then recalculated 220 for the selected set of nets with the locations constrained to defined repeater farms. Steps 210 through 229 may be repeated until satisfactory performance gain is achieved.

Figure 3:
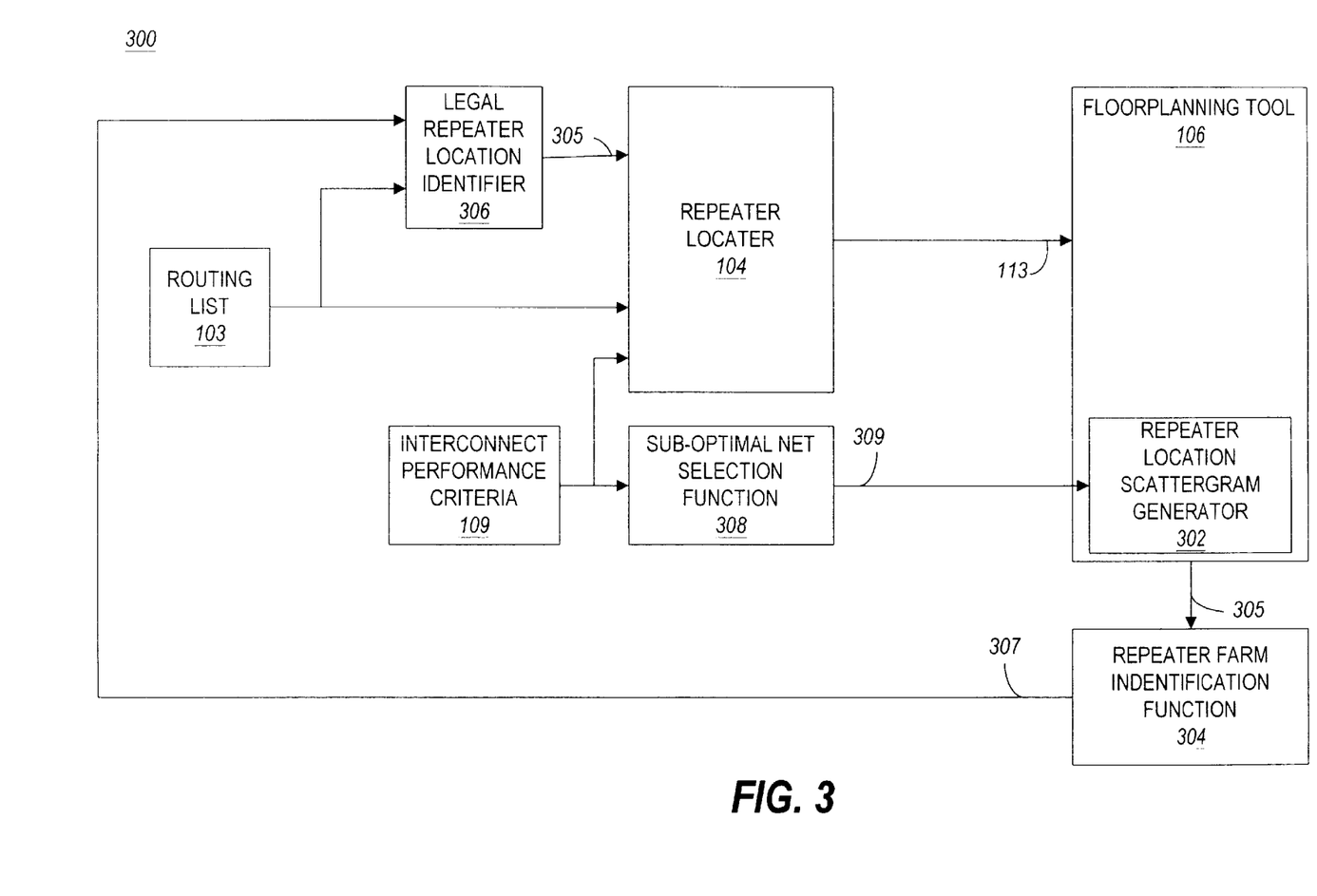
FIG. 3 is a block system flow diagram depicting the system components and inter-data flow of an illustrative embodiment of a system in accordance with the invention.

Turning now to FIG. 3, there is illustrated a block system flow diagram depicting the system components and inter-data flow of an illustrative embodiment of a system 300 for determining optimal repeater farm locations during the physical design of an integrated circuit. FIGS. 4A-4F are diagrams illustrating various CAD tool screens at various stages in the process of the invention. System 300 includes repeater locator tool 104 which receives a routing list 103 generated by a routing tool 102. When operating in an unconstrained mode, repeater locator tool 104 receives routing list 103 and a set of designer-defined repeater criteria 109. Criteria 109 includes criteria such as the maximum interconnect signal propagation delay and transition times, repeater size, etc. Repeater locator tool 104 calculates the optimal unconstrained repeater locations for each net in the routing list 103 that will result in acceptable interconnect signal performance as defined by repeater criteria 109. Repeater locator tool 104 generates a repeater location list 113 containing the calculated optimal unconstrained repeater locations.

Figure 4A:
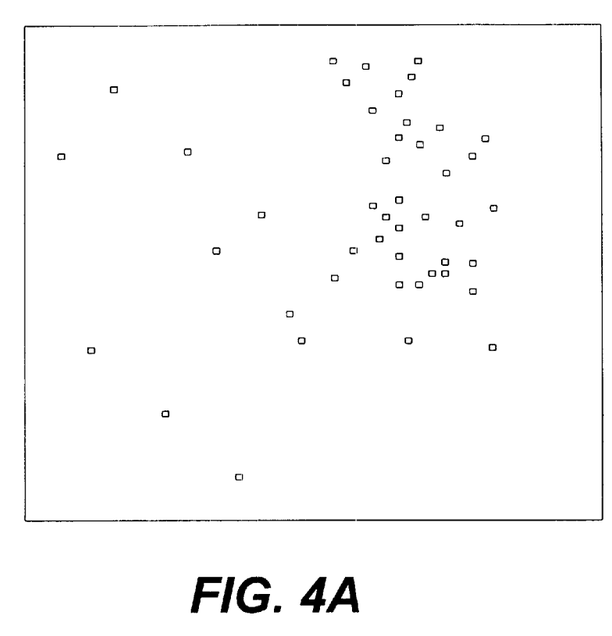
FIG. 4A is an example CAD tool screen which illustrates an example SPIT plot of unconstrained repeater locations.

Floorplanning tool 106 includes a repeater location scattergram generator 302 which generates a scattergram 305 of all of the repeater locations from the repeater location list super-imposed on the floor plan. FIG. 4A illustrates an example scattergram illustrating the unconstrained repeater locations.

Figure 4B:
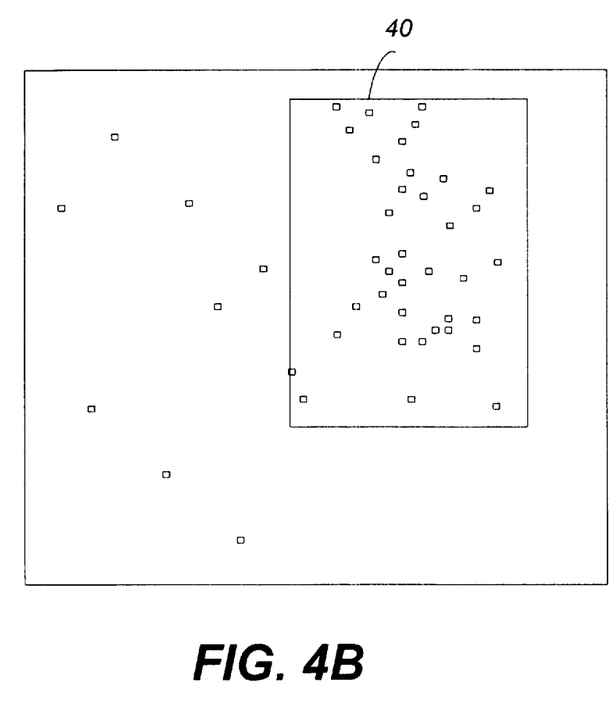
FIG. 4B is an example CAD tool screen which illustrates the identification of a repeater farm.

Repeater farm identification function 304 identifies the areas of the floorplan containing the greatest concentration of repeaters and reserves these identified areas as repeater farms. FIG. 4B illustrates the identification of a single repeater farm 40 in the area of highest concentration of repeaters. It will be understood that more than one farm may be defined during this stage. Repeater farm identification function 304 generates a repeater farm file 307 which defines the areas covered by the farms. Each farm is characterized by several properties, including:

a) the width, length, and placement of the farm;
 b) the dimensions sized to accommodate an integer amount of repeater cells;
 c) the directionality: left-right vs. up-down (determined by the direction the wire is traveling when a repeater is needed);
 d) identification of the metal layers required to accommodate metal layer of wire when repeater is needed;
 e) keep-out regions (for SLCBs and clock repeaters, etc.);
 f) set-aside metal layers (these metal layers are set aside to allow the net to dive down to the silicon, then dive back up and continue along its route); and
 g) the cell pitch defining the x,y length of the repeater cells which the farm will accommodate (in general, this will be the same among all repeater farms).

Repeater farm identification function 304 may be performed by a designer by visually locating the areas of concentration of the legal repeater locations and defining farm placement around the areas of concentration, or may be performed automatically by a CAD tool which calculates the distance between repeaters to determine the areas of concentration and define farms in those areas.

Figure 4C:
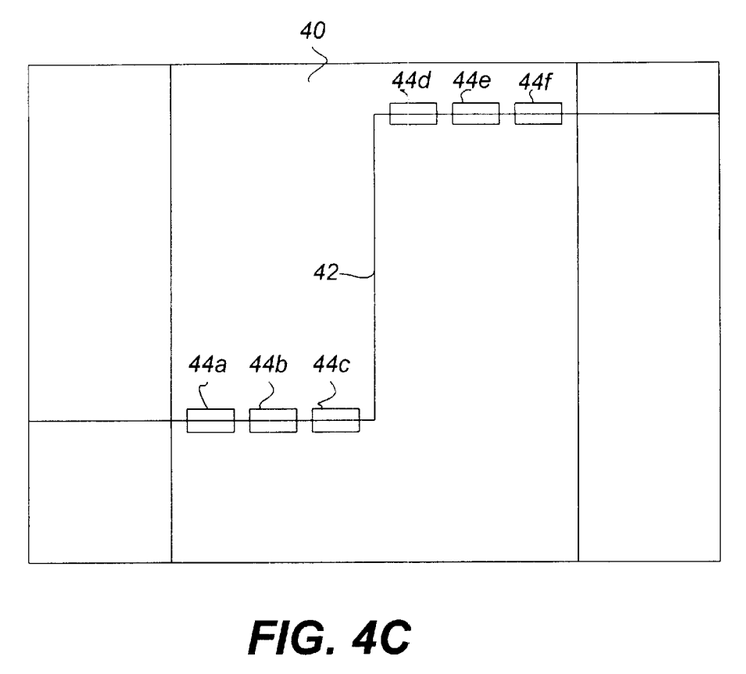
FIG. 4C is an example CAD tool screen which illustrates a single interconnect net with a route cut over a set of legal repeater cells.

The routing list 103 and repeater farm file 307 are then fed into a legal node identifier function 306. For each net in the routing list 103, legal repeater location identifier function 306 identifies the portion of the net that passes over a repeater farm as defined in repeater farm file 307. This is illustrated in FIG. 4C, which illustrates a single interconnect net 42 whose route is cut over legal repeater cell locations 44a, 44b, 44c, 44d, 44e, 44f in farm 40. The repeater cell locations over which the net passes are output in a legal repeater location file 305 that contains all of the legal repeater locations for each net in the routing list. In the preferred embodiment, repeater location tool 104 and legal repeater location identifier function 306 are implemented in accordance with U.S. patent application Ser. No. 09/329,556 to Wanek et al., supra.

Figure 4D:
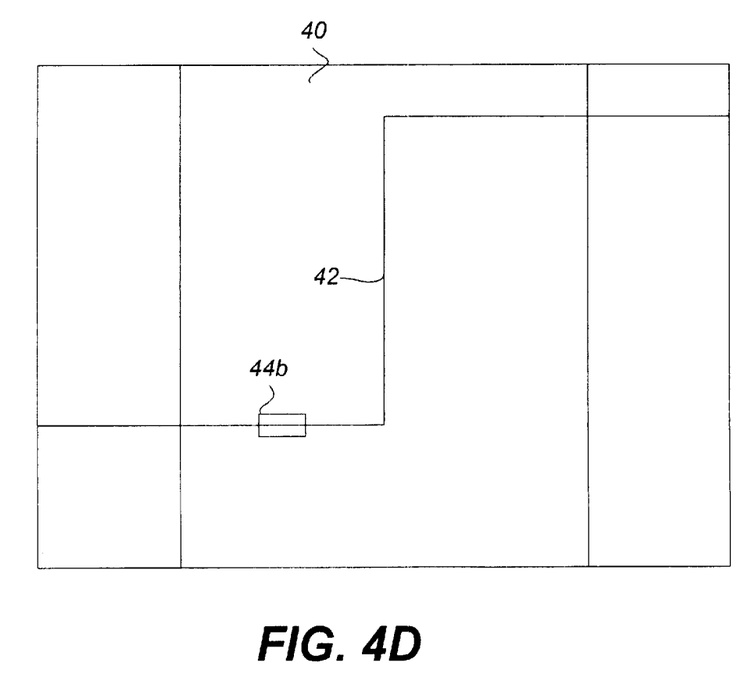
FIG. 4D is an example CAD tool screen which illustrates an example position assignment of a repeater cell among the set of legal repeater cells of FIG. 4D.

Repeater locator tool 104 is then rerun in "constrained" mode where the tool 104 calculates the optimal repeater locations when considering only the legal repeater locations as defined in the legal repeater location file 305 for each net. The repeater locator tool 104 assigns available legal repeater locations to interconnect nets as needed. FIG. 4D illustrates the example where legal repeater cell 44b is assigned to net 42.

Based on the criteria 109 for optimizing the location of repeaters, a suboptimal net selection function 308 determines which nets were hurt the most when constrained to the defined repeater farms as compared to the performance when unconstrained by the repeater farms. This indicates that the positions of the repeater farms are not optimally placed for these nets. Sub-optimal net selection function 308 then calculates the optimal unconstrained repeater locations for the selected sub-optimal nets and generates a list 309 of optimal unconstrained repeater locations for the sub-optimal nets. Sub-optimal net selection function 308 may be performed by the designer, or may be performed automatically using a CAD tool that compares timing performance of the signal interconnects before and after running the repeater locating tool in constrained mode.

Figure 4E:
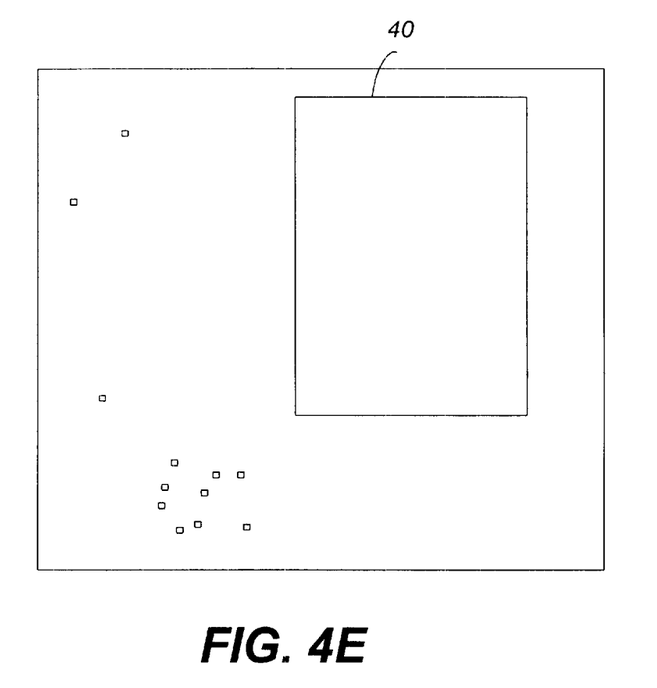
FIG. 4E is an example CAD tool screen which illustrates an example SPIT plot of optimal repeater locations of the selected sub-optimal nets.

Scattergram generator 302 then generates a scattergram 305 of the sub-optimal nets as determined by running the tool 104 in constrained mode. This scattergram 305 shows the optimal position for the repeaters of the sub-optimal interconnect nets. FIG. 4E illustrates an example scattergram of the optimal unconstrained repeater locations of the selected sub-optimal nets. As illustrated, a concentration of repeaters exists in an area outside the existing repeater farm 40.

Figure 4F:
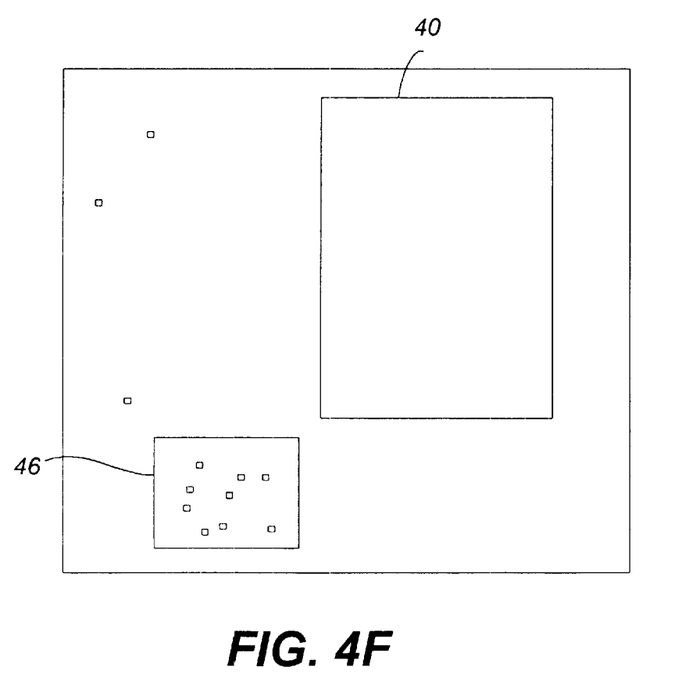
FIG. 4F is an example CAD tool screen which illustrates the creation of a new repeater farm for the sub-optimal nets.

Additional repeater farms are then defined by repeater farm identification function 304 taking into consideration the highest concentration areas indicated by the scattergram that would best accommodate the optimal positions of the repeaters for the sub-optimal nets. This is illustrated in FIG. 4F by the creation of a new repeater farm at 46. Repeater farm identification function 304 adds the newly defined repeater farms to repeater farm file 307 which defines the area covered by the farms.

The routing list 103 and repeater farm file 307 are then fed into the legal repeater location identifier 306, which again calculates the legal repeater locations for each of the nets in the routing list when constrained to the repeater farms defined in the updated repeater farm file 30. The sub-optimal net selection function 308 then determines which nets were hurt the most when constrained to the updated defined repeater farms as compared to the performance on the previous iteration, and the process repeats until the designer is satisfied with the performance of all of the nets.

The method and system for optimally locating interconnect repeater farms during the physical design of an integrated circuit described in detail above achieves several advantages over the prior art. First, the optimal placement of repeater farms afforded by the invention is effectively used to decrease interconnect signal propagation delay and transition times. Second, the invention reduces the number of unsatisfactory interconnects for high density circuits. Finally, the invention is easily automatable to allow fast and efficient determination of the optimal locations of the interconnect repeater farms.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for determining locations of interconnect repeater farms in an integrated circuit design, said design defined by a netlist defining a layout of said integrated circuit and a routing list defining a list of interconnect nets associated with said layout, said method comprising the steps of:

calculating optimal unconstrained repeater locations for each net in said routing list;

defining a set of repeater farms to areas of concentration of said optimal unconstrained repeater locations;

calculating optimal constrained repeater locations for each net in said routing list wherein said optimal constrained repeater locations are constrained to said defined repeater farms;

selecting a set of sub-optimal nets from said routing list that are hurt the most in terms of a set of performance criteria when constrained to said repeater farms;

calculating the optimal unconstrained repeater locations for said selected set of sub-optimal nets; and defining additional repeater farms to areas of concentration of said calculated optimal unconstrained repeater locations of said sub-optimal nets.

2. A method in accordance with claim 1, further comprising:

determining whether said defining of said additional repeater farms results in acceptable performance; and repeating said selecting step through said determining step if said results are not acceptable.

3. A method in accordance with claim 1, wherein said step of defining a set of repeater farms comprises:

generating a repeater location scattergram of said optimal unconstrained repeater locations;

identifying said areas of concentration of said optimal unconstrained repeater locations; and assigning each of said identified areas of concentration to a repeater farm in said set of repeater farms.

4. A method in accordance with claim 3, wherein said step of defining additional repeater farms comprises:

generating a repeater location scattergram of said calculated optimal unconstrained repeater locations of said sub-optimal nets;

identifying said areas of concentration of said calculated optimal unconstrained repeater location of said sub-optimal nets; and assigning each of said identified areas of concentration of said calculated optimal unconstrained repeater locations of said sub-optimal nets to a repeater farm in said additional repeater farms.

5. A system for determining optimal repeater farm locations in an integrated circuit design, said design defined by a netlist defining a layout of said integrated circuit and a routing list defining a list of interconnect nets associated with said layout, comprising:

a repeater locator tool which receives said routing list and a set of repeater performance criteria, and generates an optimal unconstrained repeater location list containing optimal unconstrained repeater locations when said repeater locator tool is run in an unconstrained mode and an optimal constrained repeater location list containing optimal constrained repeater locations as constrained by defined repeater farms when said repeater locator tool is run in a constrained mode;

a repeater farm identification function which identifies areas of concentration of said optimal unconstrained repeater locations and generates repeater farm file defining repeater farms corresponding to said identified areas of concentration;

a legal node identifier which identifies legal repeater locations in said defined repeater farms for each net in said routing list; and a sub-optimal net selection function which selects a set of sub-optimal interconnect nets in said routing list by determining which of said nets are hurt the most in terms of said repeater performance criteria when said repeater locator tool is run in the constrained mode as compared to when said repeater locator tool is run in the unconstrained mode.

6. A system in accordance with claim 5, wherein:

said repeater performance criteria includes one or more of a maximum interconnect signal propagation delay, specified interconnect signal transition time, and repeater size.

7. A system in accordance with claim 6, wherein:

said repeater farm identification function generates a repeater farm file which defines a size and position of said repeater farms.

8. A system in accordance with claim 5, further comprising:

a repeater location scattergram generator which generates a scattergram of said optimal unconstrained repeater locations for use by said repeater farm identification function in defining said repeater farms.

* * * * *